United States Patent [19]
Sakurai

[11] Patent Number: 4,969,024
[45] Date of Patent: Nov. 6, 1990

[54] METAL-OXIDE-SEMICONDUCTOR DEVICE

[75] Inventor: Kenya Sakurai, Matsumoto, Japan

[73] Assignee: Fuji Electric Co., Ltd., Kawasaki, Japan

[21] Appl. No.: 396,556

[22] Filed: Aug. 21, 1989

[30] Foreign Application Priority Data

Aug. 19, 1988 [JP] Japan .................................. 63-206107

[51] Int. Cl.[5] ............................................ H01L 29/78
[52] U.S. Cl. .................................. 357/23.8; 357/23.4; 357/41; 357/45; 357/89
[58] Field of Search ....................... 357/23.4, 23.8, 41, 357/45, 89

[56] References Cited

U.S. PATENT DOCUMENTS 4,803,532 2/1989 Mihara ................................. 357/23.4

Primary Examiner—Edward J. Wojciechowicz
Attorney, Agent, or Firm—Brumbaugh, Graves, Donohue & Raymond

[57] ABSTRACT

The present invention relates to a metal-oxide-semiconductor device containing a plurality of units on one semiconductor substrate. The device has a high impurity concentration region of the same conductivity type as a base layer formed near each corner of a source layer and provides improved current capacity in power applications. The high impurity concentration regions reduce a diffusion resistance in the vicinity of the corners of the source layer, thereby improving resistance of each unit to breakdown under electrical stress.

19 Claims, 3 Drawing Sheets

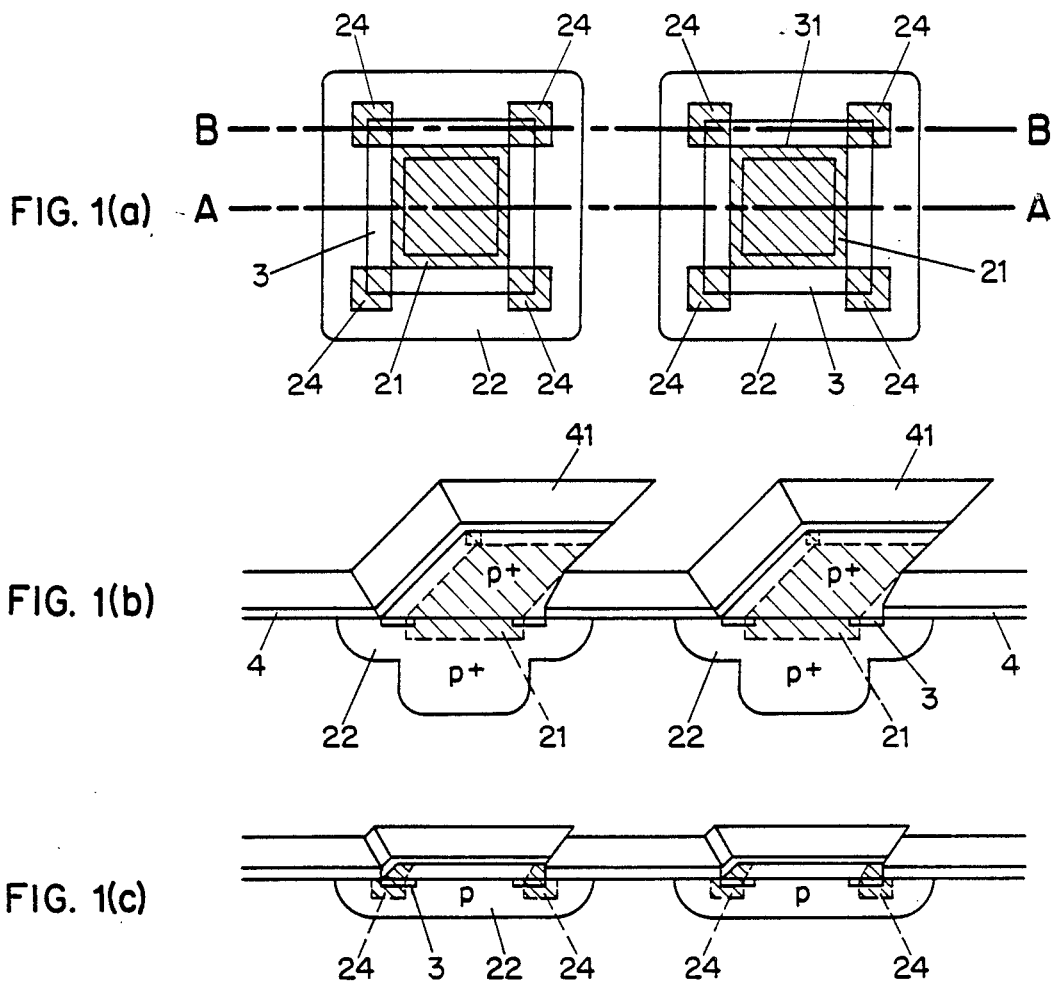
FIG. 1(a)
FIG. 1(b)
FIG. 1(c)
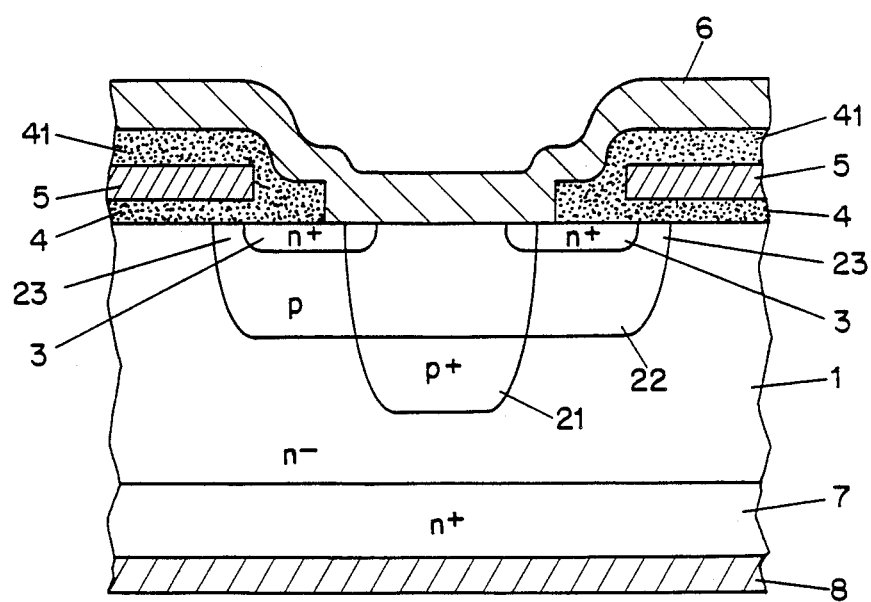
FIG. 2

METAL-OXIDE-SEMICONDUCTOR DEVICE

BACKGROUND OF THE INVENTION

The present invention relates to a metal-oxide-semiconductor (MOS) device comprising a plurality of semiconductor units on one semiconductor substrate capable of operating at high current levels.

FIG. 2 is a sectional view of a unit of power MOS field effect transistor (MOSFET). The power MOSFET includes a p+ base layer with high impurity concentration 21, a square p base layer 22, a square, annular n+ source layer 3, a gate oxide film 4, a gate electrode 5, an insulation film 41, and a source electrode 6 on one surface of an n-type silicon substrate 1. The gate electrode 5 may be, for example, of polycrystal silicon. An n+ layer 7 and a drain electrode 8 are deposed on the other surface of the silicon substrate 1. The silicon substrate 1 operates as a drain region.

As shown in FIG. 2, a channel-forming region 23 lies between the n+ source layer 3 and the drain region 1. This channel region 23 allows current to flow between the source electrode 6, which is in contact with the n+ source layer 3 and with the $p^{30}$ base layer 21, and the drain electrode 8. The gate electrode 5 also lies above n+ source layer 3 and drain region 1. An insulation film 41 separates the gate electrode 5 from the source electrode 6 which is in contact with the n+ source layer 3 and with the $p^{30}$ base layer 21. Such a power MOSFET yields increased current capacity when a plurality of square-type units are formed on the same substrate and are interconnected in parallel.

If a positive voltage relative to the source electrode 6 is applied to the gate electrode 5 of the unit, the channel region 23 of the p base layer 22 becomes inverted and forms a n channel. In this case, electrons are injected into the drain region 1 from the n+ source layer 3 through the channel region 23 when the source electrode 6 and the drain electrode 8 are set in a conductive condition. If a negative voltage relative to the source electrode 6 is applied to the gate electrode 5 of the unit, the conductive state is inverted when the source electrode 6 and the drain electrode 8 are set in a conductive condition. Thus, the unit can operate as a switching element.

A MOS device comprising a plurality of units shown in FIG. 2 may be used in electrical apparatus. The apparatus may generate a spike voltage or a high voltage rising rate (dv/dt) having a high energy due to an inductive load such as inductance between wiring. This electrical stress often causes the MOSFET to break down.

FIG. 3 illustrates a breakdown phenomenon. The power MOSFET breaks down when a voltage exceeding the breakdown voltage of the power MOSFET is applied and the power MOSFET cannot absorb such energy During breakdown, avalanche multiplication in a depletion layer 9 indicated by a broken line in FIG. 3 generates a current. This avalanche current comprises a hole current $J_p$ flowing into the source electrode 6 and an electron current flowing into the drain electrode 8. Since the hole current $J_p$ flows through a diffusion resistance $R_b$ under the n+ source layer 3, a voltage difference of $(J_p \times R_b)$ exists in an area under the $n^{30}$ source layer 3. If this voltage difference exceeds a diffusion voltage of approximately 0.6 volts between the n+ source layer 3 and the p base layer 22, electrons are injected from the n+ source layer 3, and a parasitic npn transistor comprising source layer 3, p base layer 22, and n− drain region 1 turns on. The result under these circumstances is a gate uncontrollable condition which leads to breakdown.

In order to increase an avalanche current capability, concentrations and diffusion depths of the $p^{30}$ base layer 21 and of the p base layer 22 should be increased. However, these measures also cause an on resistance $R_{on}$, which is the main characteristic of the power MOSFET, to increase and a breakdown voltage $V_{dss}$ to decrease As shown in FIG. 4 and in FIG. 5, the on resistance $R_{on}$ is a function of an interval $L_g$ between the p base layers 22 of adjacent units. Line 51 shows $R_{on}$ as a function of $L_g$ when $V_{Dss}$ is 500 V. Line 52 shows $R_{on}$ as a function of $L_g$ when $V_{Dss}$ is 100 V. Referring to FIG. 5, a larger $L_g$ is required to reduce $R_{on}$ in the power MOSFET having a breakdown voltage of 400 volts or higher.

When $L_g$ is small, FIG. 4 shows that the depletion layers 9 of adjacent units are coupled. By widening $L_g$, a depletion layer volume under the gate electrode 5 increases and a field intensity in the p base layer 22 increases due to separation of the depletion layers of the units and to small curvature of the depletion layer. As a result, the avalanche hole current $J_p$ flowing under the n+ source layer 3 increases significantly, and the turn-on phenomenon of the parasitic bipolar transistor accelerates. A unit then readily breaks down. Breakdown occurs at weak areas of uncertain units which are among several tens of thousands of units integrated on one semiconductor substrate. It is difficult to fabricate many units which operate in the same way and are equally reliable under severe electrical stress.

Accordingly, it is an object of the present invention to solve the above-described problems and to provide a metal-oxide-semiconductor device capable of operating at higher current levels or at increased current capacity comprising a plurality of units, each having a higher avalanche current capability without resulting in an increase of $R_{on}$ and in a decrease of $V_{Dss}$. That is, each unit has improved resistance to breakdown under electrical stress.

SUMMARY OF THE INVENTION

To overcome the problems, the present invention discloses a metal-oxide-semiconductor device providing improved current capacity in power applications comprising a plurality of units formed on one semiconductor substrate.

Each of these units may comprise: a drain region of a first conductivity type of semiconductor material; a base layer of a second conductivity type of semiconductor material deposed on the drain region; a source layer of generally rectangular form of a first conductivity type of semiconductor material with high impurity concentration deposed on the base layer; and four base layer regions with high impurity concentration of the same conductivity type as the base layer respectively deposed on the base layer under corners of the source layer. As described, the four base layer regions reduce a diffusion resistance in the vicinity of the corners of the source layer, thereby improving resistance of each such unit to breakdown under electrical stress and permitting operation of the composite device at higher current levels.

BRIEF DESCRIPTION OF THE DRAWINGS

FIGS. 1(a), (b), and (c) show an embodiment of the present invention; (a) is a plan top view of a semiconductor substrate, (b) is a sectional view along a line A—A of (a), and (c) is a perspective view of upper structure of the substrate along a line B—B of (a);

FIG. 2 is a sectional view of a unit of power MOSFET;

For convenience of reference, like components, elements, and features in the various figures are designated by the same reference numerals or characters.

DESCRIPTION OF THE PREFERRED EMBODIMENT

Figure 3:
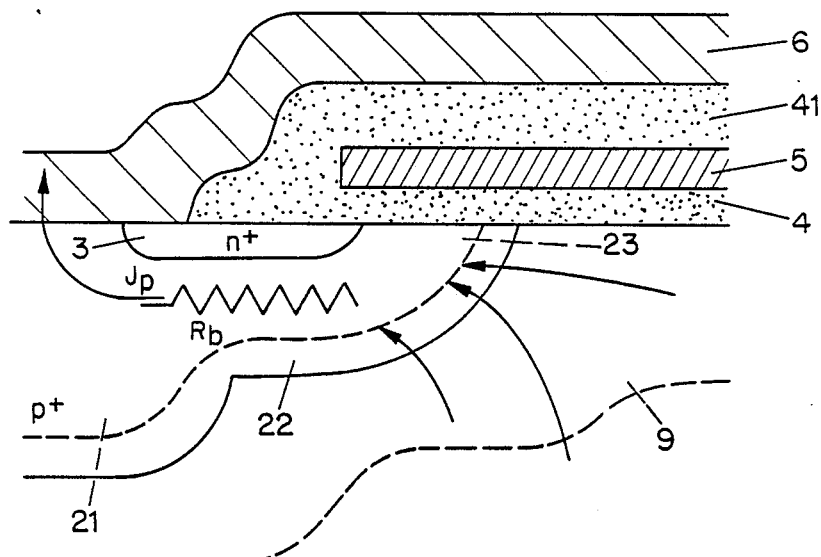
FIG. 3 is an enlarged sectional view of a region where the breakdown phenomenon in the power MOSFET of FIG. 2 occurs.
Figure 4:
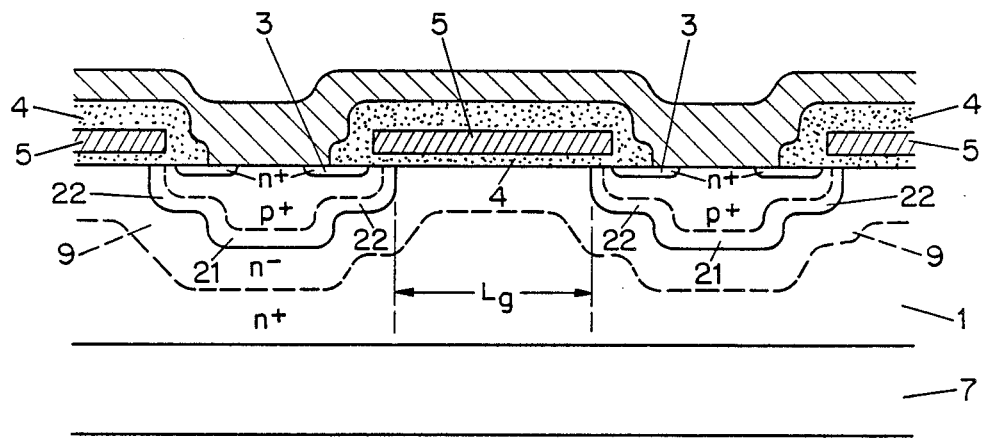
FIG. 4 is a sectional view showing two semiconductor units formed on one semiconductor substrate and an area between the two units.
Figure 5:
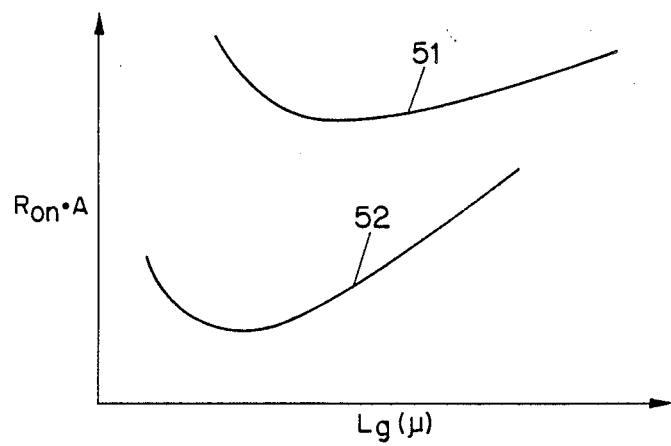
FIG. 5 is a graphical representation illustrating a relationship between $L_g$ and $R_{on}$ the power MOSFET shown in FIG. 4.
Figure 6:
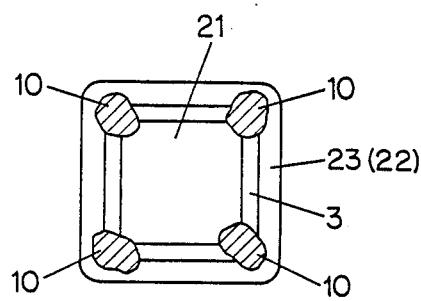
FIG. 6 is a plan top view showing the breakdown phenomenon in the unit.

As described above, breakdown occurs when the parasitic bipolar transistor turns on and the current level increases. The region of the power MOSFET in which this occurs is in the vicinity of corners of the source layer. FIG. 6 shows a plan top view of a unit without the source electrode, gate electrode and insulation layers. Current may easily concentrate at the corners of source layer 3, and breakdown areas 10 are generated therein.

When a high impurity concentration region is formed under each corner of the source layer outside the base layer with high impurity concentration, the diffusion resistance $R_b$ of such region decreases. Thus, avalanche current is bypassed, and the turning on of the parasitic bipolar transistor is suppressed.

FIGS. 1(a), (b), and (c) show an embodiment of the present invention. FIG. 1(a) is a plan top view of two units of power MOSFET without the source electrode, gate electrode, and insulation layers. FIG. 1(b) is a sectional view along the line A—A in FIG. 1(a). A more detailed sectional view of one power MOSFET unit along the line A—A in FIG. 1(a) is provided in FIG. 2 (which is representative of a unit in accordance with the invention, since line A—A does not pass through the corner regions specific to the invention.) FIG. 1(c) is a perspective view of upper structure of the substrate along a line B—B in FIG. 1(a) with gate oxide film and with insulation film on the substrate. As these figures show, a $p^{30}$ corner layer 24 is deposed in the vicinity of each corner of source layer 3 in addition to the base layer of high impurity concentration 21. $R_b$ is thereby reduced.

Figure 7:
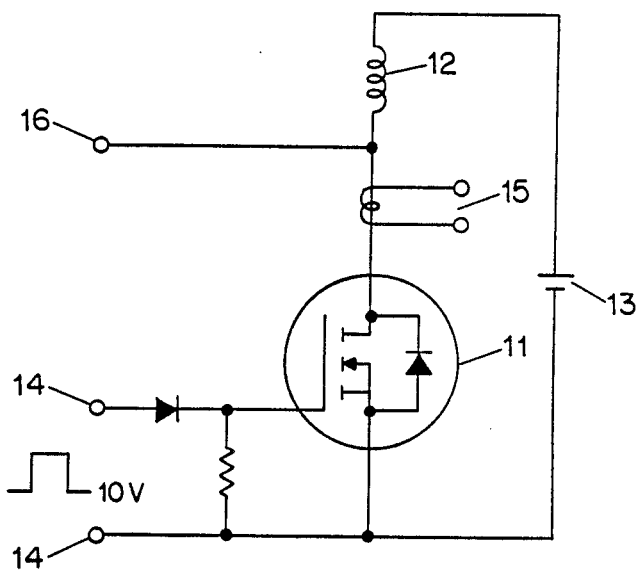
FIG. 7 is a circuit diagram for a test circuit for the power MOSFET.

A power MOSFET embodying the structure of FIGS. 1(a), (b), and (c) has been measured with a test circuit shown in FIG. 7. A power supply 13 provides a DC voltage of $V_{DD}=50$ volts to an inductive load 12 of 100 μH and to the power MOSFET 11. Through terminals 14, a rectangular gate voltage is applied across the gate electrode and the source electrode.

Figure 8:
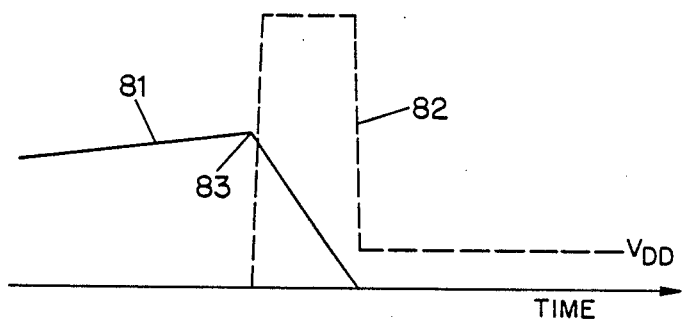
FIG. 8 is a graphical representation illustrating behaviors of a current and of a voltage with respect to time measured using the test circuit shown in FIG. 7.

Referring to FIGS. 7 and 8, a current probe 15 measures a drain-source current illustrated by line 81. A drain-source voltage measured at terminal 16 is indicated by line 82. At point 83, the drain-source current starts to decrease because of a cut-off condition in the channel-forming region of the power MOSFET. However, the inductive load 12 causes the drain-source voltage to increase at point 83. The embodiment of the present invention is resistive to an avalanche voltage as shown by the horizontal plateau of line 82, and the drain-source voltage thereafter decreases and returns to $V_{DD}$. This test result suggests that a power MOSFET with an avalanche current capability ten times higher than that of a power MOSFET of the prior art can be obtained.

Each unit of the present embodiment has a structure along the line A—A in FIG. 1(a) which is accurately represented by the FIG. 2 view. Specifically, a plurality of these units are formed on one semiconductor substrate and are arranged for parallel interconnection. A first base layer of a second conductivity type of semiconductor material 22 is deposed on drain region of a first conductivity type of semiconductor material 1. A second base layer of a second conductivity type of semiconductor material with high impurity concentration 21 is deposed on the first base layer 22. An annular source layer of generally rectangular form of a first conductivity type cf semiconductor material with high impurity concentration 3 is deposed on the first base layer 22, partially overlapping the second base layer 21. As illustrated in FIGS. 1(a) and (c), four base layer regions 24 with high impurity concentration of the same conductivity type as the base layers 21 and 22 are respectively deposed on base layer 22 under corners of the source layer 3. These base layer regions 24, as previously discussed, reduce $R_b$ in the vicinity of the corners of the source layer 3, thereby improving resistance of each unit to breakdown. Consequently, the composite device can operate at higher current levels.

Figure 9:
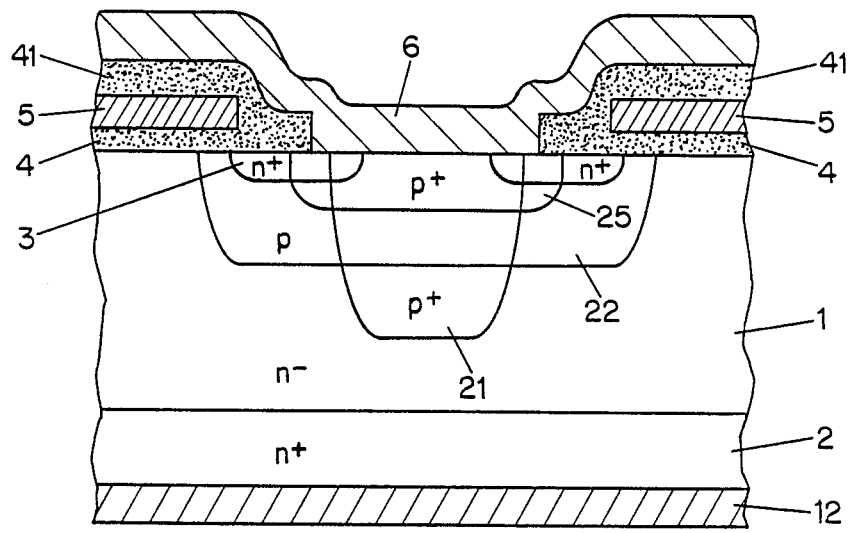
FIG. 9 is a sectional view showing another embodiment of the present invention in which a third base layer with high impurity concentration 5 is deposed on the drain region.

The improvement in the above-described embodiment can be enhanced by deposing a third p-type base layer with high impurity concentration which is shallower than the $p^{30}$ base layer and wider than the p base layer. FIG. 9 shows such a modification with the third base layer 25 deposed on a second $p^+$ base layer 21 which in turn is deposed on a first p base layer 22.

In order to obtain a power MOSFET highly resistant to breakdown and to overcome the problem with units on one semiconductor substrate having different breakdown strengths, this invention provides a MOS device with high impurity concentration regions of the same conductivity type as the base layer formed at the four corners of each source layer. The avalanche current, due to a voltage spike or to high dv/dt generated when a MOS device containing a plurality of units on one semiconductor substrate is used with an inductive load, is concentrated to the corners of the source layer. Breakdown may thus occur at these corners.

Although the invention has been described herein with reference to specific embodiments, many modifications and variations of the invention will readily occur to those skilled in the art. Accordingly, all such variations and modifications are included within the intended scope of the invention.

I claim:

1. A metal-oxide-semiconductor device providing improved current capacity in power applications comprising:
   a plurality of semiconductor units formed on one semiconductor substrate and arranged for parallel interconnection, each said unit comprising:
   a drain region of a first conductivity type of semiconductor material;
   a base layer of a second conductivity type of semiconductor material deposed on said drain region;
   a source layer of generally rectangular form of a first conductivity type of semiconductor material with high impurity concentration deposed on said base layer; and
   four base layer regions with high impurity concentration of the same conductivity type as the base layer respectively deposed on the base layer under corners of the source layer;
   whereby said four base layer regions reduce a diffusion resistance in the vicinity of the corners of the source layer, thereby improving resistance of each such unit to breakdown under electrical stress and permitting operation of the composite semiconductor device at higher current levels.

2. A metal-oxide-semiconductor device according to claim 1 in which the semiconductor unit is a power metal-oxide-semiconductor field effect transistor.

3. A metal-oxide-semiconductor device according to claim 1 in which the base layer is of generally rectangular form.

4. A metal-oxide-semiconductor device according to claim 1 in which a second base layer of a second conductivity type cf semiconductor material with high impurity concentration is deposed on the base layer, extending into the drain region.

5. A metal-oxide-semiconductor device according to claim 4 in which a third base layer of a second conductivity type of semiconductor material with high impurity concentration is deposed on the base layer, shallower than the base layer and wider than the second base layer.

6. A metal-oxide-semiconductor device according to claim 1 in which the source layer is of annular form and is adjacent to a channel-forming region between the source layer and the drain region.

7. A metal-oxide-semiconductor device according to claim 6 in which a gate electrode of polycrystal silicon is coupled to the channel-forming region of the base layer through a gate oxide film deposed in the vicinity of said channel-forming region.

8. A metal-oxide-semiconductor device according to claim 7 in which a source electrode is insulated from the gate electrode by an insulation film and is deposed in contact with the annular source layer and with the base layer.

9. A metal-oxide-semiconductor device according to on of claims 1–8 in which the semiconductor material is silicon, the first conductivity type is n and the second conductivity type is p.

10. A metal-oxide-semiconductor unit resistant to breakdown under electrical stress comprising:
    a drain region of a first conductivity type of semiconductor material;
    a base layer of a second conductivity type of semiconductor material deposed on said drain region;
    an annular source layer of generally rectangular form of a first conductivity type of semiconductor material with high impurity concentration deposed on said base layer adjacent to a channel-forming region between said source layer and said drain region; and
    four base layer regions with high impurity concentration of the same conductivity type as the base layer respectively deposed in the base layer under corners of the source layer;
    whereby said four base layer regions reduce a diffusion resistance in the vicinity of the corners of the source layer, thereby improving resistance of the unit to breakdown under electrical stress.

11. A metal-oxide-semiconductor unit according to claim 10 in which the unit is a power metal-oxide-semiconductor field effect transistor.

12. A metal-oxide-semiconductor unit according to claim 10 in which the base layer is of generally rectangular form.

13. A metal-oxide-semiconductor unit according to claim 10 in which a second base layer of a second conductivity type of semiconductor material with high impurity concentration is deposed on the base layer, extending into the drain region.

14. A metal-oxide-semiconductor unit according to claim 13 in which a third base layer of a second conductivity type of semiconductor material with high impurity concentration is deposed on the base layer, shallower than the base layer and wider than the second base layer.

15. A metal-oxide-semiconductor unit according to claim 10 in which a gate electrode of polycrystal silicon is coupled to the channel-forming region of the base layer through a gate oxide film deposed in the vicinity of said channel-forming region.

16. A metal-oxide-semiconductor unit according to claim 15 in which a source electrode is insulated from the gate electrode by an insulation film and is deposed in contact with the annular source layer and with the base layer.

17. A metal-oxide-semiconductor unit according to on of claims 10–16 in which the semiconductor material is silicon, the first conductivity type is n and the second conductivity type is p.

18. A metal-oxide-semiconductor device providing improved current capacity in power applications comprising:
    a plurality of power metal-oxide-semiconductor field effect transistor units formed on one silicon substrate and arranged for parallel interconnection, each said unit comprising:
    a drain electrode;
    a first drain region of n-type silicon with high impurity concentration deposed on said drain electrode;
    a second drain region of n-type silicon deposed on said first drain region;
    a first base layer of generally rectangular form of p-type silicon deposed on said second drain region;
    a second base layer of generally rectangular form of p-type silicon with high impurity concentration deposed on said first base layer, extending into said second drain region;
    an annular source layer of generally rectangular form of n-type silicon with high impurity concentration deposed on said first base layer, adjacent to a channel-forming region between said source layer and said second drain region and partially overlapping said second base layer;
    a gate electrode of polycrystal silicon coupled to said channel-forming region of the first base layer through a gate oxide film deposed in the vicinity of said channel-forming region;

a source electrode insulated from said gate electrode by an insulation film and deposed in contact with said source layer; and four p-type base layer regions with high impurity concentration respectively deposed on a limited area of the first base layer under each corner of the annular source layer;

whereby said four base layer regions reduce a diffusion resistance in the vicinity of the corners of the annular source layer, thereby improving resistance of each such unit to breakdown under electrical stress and achieving increased current capacity of the composite semiconductor device.

19. A metal-oxide-semiconductor device according to claim 18 in which a third base layer of generally rectangular form of p-type silicon with high impurity concentration is deposed on the first base layer such that:

the third base layer is shallower than the first base layer;

the third base layer is wider than the second base layer;

the annular source layer partially overlaps the third base layer; and the source electrode is deposed in contact with the third base layer.

* * * * *

UNITED STATES PATENT AND TRADEMARK OFFICE
CERTIFICATE OF CORRECTION

PATENT NO. : 4,969,024
DATED : November 6, 1990
INVENTOR(S) : Kenya Sakurai

It is certified that error appears in the above-identified patent and that said Letters Patent is hereby corrected as shown below:

Column 1, line 25, "$p^{30}$" should read --$p^+$--;

Column 1, line 30, "$p^{30}$" should read --$p^+$--;

Column 1, line 65, "$n^{30}$" should read --$n^+$--;

Column 2, line 6, "$p^{30}$" should read --$p^+$--;

Column 2, line 10, "$V_{dss}$" should read --$V_{Dss}$--;

Column 3, line 25, "5" should read --25--;

Column 3, line 61, "$p^{30}$" should read --$p^+$--;

Column 4, line 46, "$p^{30}$" should read --$p^+$--.

Signed and Sealed this

Eleventh Day of January, 1994

Attest:

BRUCE LEHMAN

Attesting Officer

Commissioner of Patents and Trademarks